(12) United States Patent
Saha

(10) Patent No.: US 11,545,950 B2
(45) Date of Patent: Jan. 3, 2023

(54) APPARATUS AND METHODS FOR VECTOR MODULATOR PHASE SHIFTERS

(71) Applicant: Analog Devices, Inc., Norwood, MA (US)

(72) Inventor: Prabir K. Saha, Hillsboro, OR (US)

(73) Assignee: Analog Devices, Inc., Norwood, MA (US)

( * ) Notice: Subject to any disclaimer, the term of this patent is extended or adjusted under 35 U.S.C. 154(b) by 128 days.

(21) Appl. No.: 16/855,256

(22) Filed: Apr. 22, 2020

(65) Prior Publication Data

US 2020/0382088 A1 Dec. 3, 2020

Related U.S. Application Data

(60) Provisional application No. 62/856,531, filed on Jun. 3, 2019.

(51) Int. Cl.
*H03G 3/30* (2006.01)
*H03G 1/00* (2006.01)
*H03H 11/22* (2006.01)

(52) U.S. Cl.
CPC ......... *H03G 3/3047* (2013.01); *H03G 1/0088* (2013.01); *H03G 3/301* (2013.01); *H03H 11/22* (2013.01)

(58) Field of Classification Search
CPC .... H03G 3/3047; H03G 3/301; H03G 1/0088; H03H 11/22
See application file for complete search history.

(56) References Cited

U.S. PATENT DOCUMENTS 7,323,933 B2  1/2008 Gilbert
7,756,491 B2  7/2010 Kee et al.
(Continued)

FOREIGN PATENT DOCUMENTS

EP         3404832 A1   11/2018
WO   WO 2010/021280 A1   2/2010
WO   WO 2017/149698 A1   9/2017

OTHER PUBLICATIONS

Hettak, et al., "A Novel Topology of SiGe Phase Shifters using Vector Sum Method with ultra-low Power Consumption for 5GHz applications" dated Jan. 2019 in 4 pages.
(Continued)

*Primary Examiner* — Junpeng Chen
(74) *Attorney, Agent, or Firm* — Knobbe, Martens, Olson & Bear, LLP

(57) ABSTRACT

Apparatus and methods for vector modulator phase shifters are provided. In certain embodiments, a phase shifter includes a quadrature filter that filters a differential input signal to generate a differential in-phase (I) voltage and a differential quadrature-phase (Q) voltage, an in-phase variable gain amplifier (I-VGA) that amplifies the differential I voltage to generate a differential I current, a quadrature-phase variable gain amplifier (Q-VGA) that amplifies the differential Q voltage to generate a differential Q current, and a current mode combiner that combines the differential I voltage and the differential Q voltage to generate a differential output signal. A phase difference between the differential output signal and the differential input signal is controlled by gain settings of the I-VGA and the Q-VGA.

20 Claims, 14 Drawing Sheets

(56) References Cited

U.S. PATENT DOCUMENTS

| | | |
|---|---|---|
| 7,915,956 B2 | 3/2011 | Gilbert |
| 7,979,042 B2 | 7/2011 | Afsahi et al. |
| 8,416,882 B2 | 4/2013 | Corman et al. |
| 8,497,735 B2 | 7/2013 | Gilbert |
| 8,687,968 B2 | 4/2014 | Nosaka et al. |
| 8,724,739 B2 | 5/2014 | Morton et al. |
| 8,736,336 B2 | 5/2014 | Kishimoto |
| 8,817,834 B2 | 8/2014 | Wang et al. |
| 9,231,559 B1 | 1/2016 | Davis |
| 9,257,746 B2 | 2/2016 | Chen et al. |
| 9,450,520 B2 | 9/2016 | Chi et al. |
| 10,020,797 B2 | 7/2018 | Soga |
| 2006/0133548 A1 | 6/2006 | Oh et al. |
| 2007/0275674 A1 | 11/2007 | Chien |
| 2008/0219378 A1* | 9/2008 | Aggarwal ............... H04L 27/38 375/298 |
| 2010/0327932 A1* | 12/2010 | Aparin ................ H04B 1/0475 327/254 |
| 2014/0065985 A1* | 3/2014 | Weissman ................ H04B 1/40 455/86 |
| 2016/0233908 A1* | 8/2016 | Mak ......................... H03F 3/19 |
| 2018/0323771 A1 | 11/2018 | Maruyama et al. |
| 2019/0372538 A1* | 12/2019 | Roeckner ............ H03F 3/45179 |
| 2020/0144993 A1 | 5/2020 | Saha |
| 2020/0350679 A1* | 11/2020 | Yu ....................... H03F 3/45179 |

OTHER PUBLICATIONS

Min, et al., "Ka-Band SiGe HBT Low Phase Imbalance Differential 3-bit Variable Gain LNA." IEEE Microwave and Wireless Components Letters, vol. 18, No. 4, Apr. 2008, in 3 pages.

Özeren, Emre, High Resolution, Process and Temperature Compensated Phase Shifter Design using a Self Generated Look Up Table, Sabanei Univeristy, dated Aug. 2016, in 124 pages.

Parlak et al., "A 6-bit Wideband Variable Gain Amplifier with Low Group Delay Variation in 90nm CMOS," IEEE 978-1-4577-1318-7, dated 2012, pp. 147-150.

Shahramian, et al., "A 70-100 GHz Direct-Conversion Transmitter and Receiver Phased Array Chipset Demonstrating 10 Gb/s Wireless Link," IEEE Journal of Solid-State Circuits, vol. 48, No. 5, dated May 2013, in 13 pages.

* cited by examiner

APPARATUS AND METHODS FOR VECTOR MODULATOR PHASE SHIFTERS

CROSS-REFERENCE TO RELATED APPLICATIONS

The present application claims priority to U.S. Provisional Patent Application No. 62/856,531, filed Jun. 3, 2019, and titled "APPARATUS AND METHODS FOR VECTOR MODULATOR PHASE SHIFTERS," the entirety of which is hereby incorporated herein by reference.

FIELD OF THE DISCLOSURE

Embodiments of the invention relate to electronic systems, and more particularly, to phase shifters.

BACKGROUND

Phase shifters are used in a variety of applications to control the phase of an electronic signal, such as a radio frequency (RF) signal. Example applications using phase shifters for phase control include ultrasound, radar, lidar, and/or cellular communications.

In one example, a phased array antenna system includes phase shifters along RF signal paths to an antenna array, thereby providing a mechanism for controlling the phase of RF signals that combine using constructive and destructive interference to provide beamforming.

SUMMARY OF THE DISCLOSURE

Apparatus and methods for vector modulator phase shifters are provided. In certain embodiments, a phase shifter includes a quadrature filter that filters a differential input signal to generate a differential in-phase (I) voltage and a differential quadrature-phase (Q) voltage, an in-phase variable gain amplifier (I-VGA) that amplifies the differential I voltage to generate a differential I current, a quadrature-phase variable gain amplifier (Q-VGA) that amplifies the differential Q voltage to generate a differential Q current, and a current mode combiner that combines the differential I voltage and the differential Q voltage to generate a differential output signal. A phase difference between the differential output signal and the differential input signal is controlled by gain settings of the I-VGA and the Q-VGA. Thus, the differential input signal is partitioned into I and Q components which are scaled with appropriate amplitudes to reconstruct the differential output signal with a desired phase shift. By combining the I and Q components using summing in current mode, wide operational bandwidth is achieved. For example, using current mode combining enhances accuracy in combining I and Q signal components and/or helps to reduce parasitic capacitances at the output to provide wideband operation. Calibration schemes for such phase shifters are also provided.

In one aspect, a phase shifter with wideband operation is provided. The phase shifter includes a quadrature filter configured to filter an input signal to generate an in-phase (I) voltage and a quadrature-phase (Q) voltage, a first variable gain amplifier (VGA) configured to amplify the I voltage to generate an I current, a second VGA configured to amplify the Q voltage to generate a Q current, and a current mode combiner configured to combine the I current and the Q current to generate an output signal. A first gain setting of the first VGA and a second gain setting of the second VGA are operable to control a phase shift between the output signal and the input signal.

In another aspect, a method of phase shifting is provided. The method includes filtering an input signal to generate an in-phase (I) voltage and a quadrature-phase (Q) voltage, amplifying the I voltage to generate an I current using a first variable gain amplifier (VGA) of a phase shifter, amplifying the Q voltage to generate a Q current using a second VGA of the phase shifter, combining the I current and the Q current to generate an output signal using a current mode combiner of the phase shifter, and controlling a phase shift between the output signal and input signal by controlling a first gain setting of the first VGA and a second gain setting of the second VGA.

In another aspect, a front end system for controlling beamforming in an active scanned electronically steered array is provided. The front end system includes an amplifier, and a phase shifter in series with the amplifier and configured to control a phase of a radio frequency (RF) input signal. The phase shifter includes a quadrature filter configured to filter the RF input signal to generate an in-phase (I) voltage and a quadrature-phase (Q) voltage, a first variable gain amplifier (VGA) configured to amplify the I voltage to generate an I current based on a first gain setting, a second VGA configured to amplify the Q voltage to generate a Q current based on a second gain setting, and a current mode combiner configured to combine the I current and the Q current to generate an RF output signal.

DETAILED DESCRIPTION OF EMBODIMENTS

Figure 1:
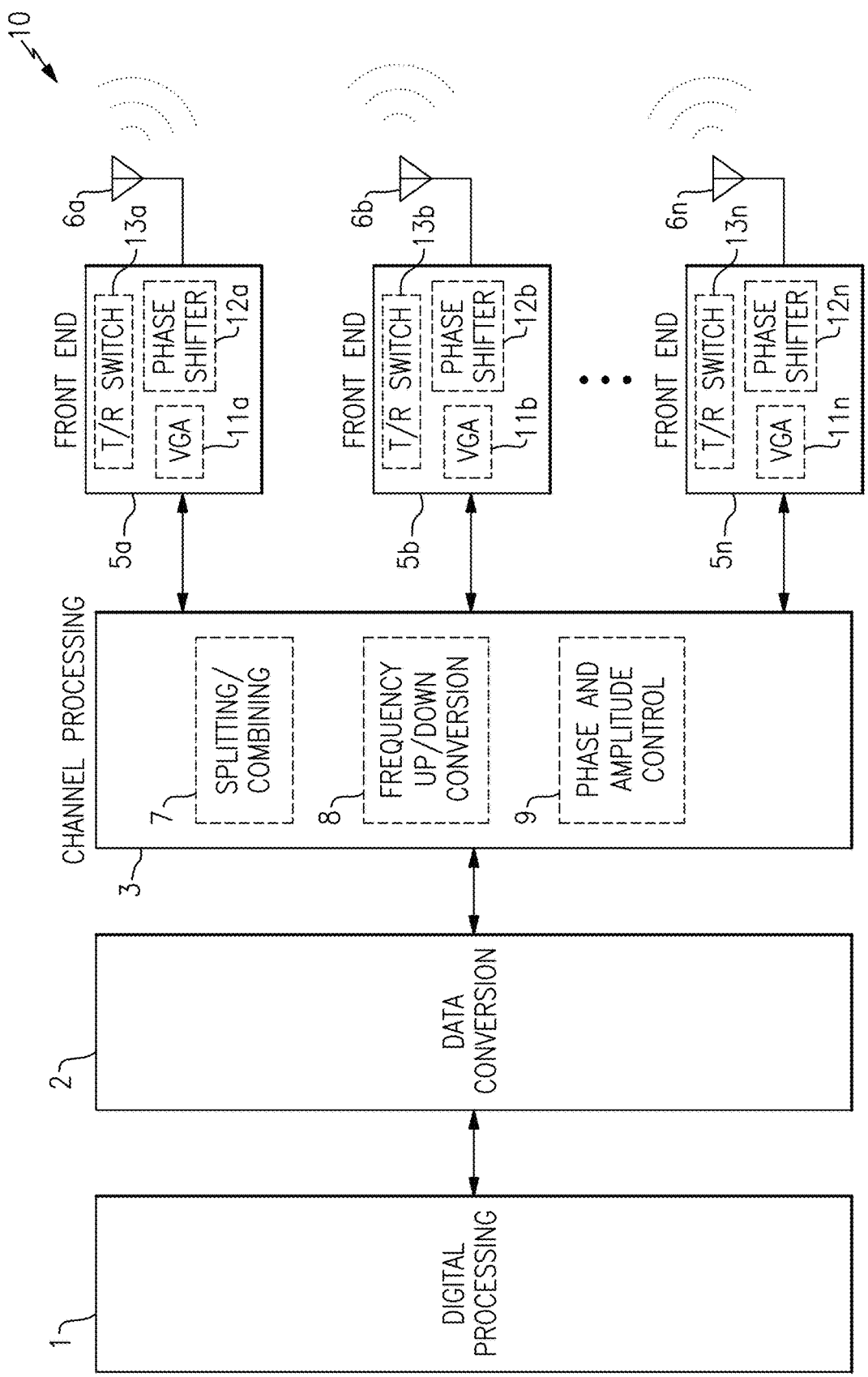
FIG. 1 is a schematic diagram of one embodiment of a phased array antenna system including phase shifters.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Apparatus and methods for vector modulator phase shifters are provided. In certain embodiments, a phase shifter includes a quadrature filter that filters a differential input signal to generate a differential in-phase (I) voltage and a differential quadrature-phase (Q) voltage, an in-phase variable gain amplifier (I-VGA) that amplifies the differential I voltage to generate a differential I current, a quadrature-phase variable gain amplifier (Q-VGA) that amplifies the differential Q voltage to generate a differential Q current, and a current mode combiner that combines the differential I voltage and the differential Q voltage to generate a differential output signal. A phase difference between the differential output signal and the differential input signal is controlled by gain settings of the I-VGA and the Q-VGA.

Thus, the differential input signal is partitioned into I and Q components which are scaled with appropriate amplitudes to reconstruct the differential output signal with a desired phase shift. By combining the I and Q components using summing in current mode, wide operational bandwidth is achieved. For example, using current mode combining enhances accuracy in combining I and Q signal components and/or helps to reduce parasitic capacitances at the output to provide wideband operation.

In certain implementations, the I-VGA and the Q-VGA are implemented with selectable transconductance stages operating in parallel, and a combination of active or selected transconductance stages changes based on each VGA's gain setting. Additionally, the selectable transconductance stages are implemented with current steering circuitry for steering the stage's current to a desired output or to another destination (for instance, a supply voltage) to maintain a current density of active transconductance stages substantially constant for each value of the gain setting.

In certain implementations, the current steering circuitry can steer the stage's current to either a non-inverted output or an inverted output of the VGA, which allows a polarity of the VGA's differential output current to be flipped. Thus, when both the I-VGA and the Q-VGA are implemented in this manner, the phase shifter can provide phase shifting over a full 3600 range associated with all four quadrants of an I/Q plot, rather than being limited to providing phase shifting in one quadrant (for instance, an upper-right quadrant of an I/Q plot associated with positive values of I and Q components).

The current mode combiner can be implemented in a wide variety of ways. In certain implementations, the current mode combiner includes a pair of cascode transistors associated with a common-base stage or a common-gate stage. For example, a non-inverted I current component and an inverted Q current component can be provided to an emitter or a source of a first cascode transistor, while an inverted I current component and a non-inverted Q current component can be provided to an emitter or a source of a second cascode transistor. Implementing the current mode combiner in this manner provides low input impedance to reduce inaccuracies arising from varying VGA output impedance with changing gain.

In certain implementation, the current mode combiner uses a pair of output matching capacitors for integrating a differential combined current. For example, each cascode transistor of the common-base stage or the common-gate stage can be placed in series with a corresponding one of the output matching capacitors. Furthermore, in certain implementations, a pair of output matching inductors is used to power the common-base stage or the common-gate stage. By utilizing the output matching components for multiple functions, reduced parasitic capacitance is provided to widen bandwidth.

The gain settings of the I-VGA and the Q-VGA are controlled to provide a desired phase shift. In certain implementations, a control circuit is included for choosing values of the gain settings of the I-VGA and Q-VGA based on an input control signal indicating a desired phase shift. For example, the input control signal can be received over a serial interface or bus of a semiconductor die on which the phase shifter is fabricated. The control circuit can include a mapping table for mapping the input control signal to corresponding values of the VGA gain settings.

In certain implementations, the mapping table is calibrated to compensate for I/Q imbalance, for enhanced performance at a particular operating frequency, and/or to compensate for process, voltage, and/or temperature (PVT) variation.

Such calibration can include setting the phase shifter in a first phase state by controlling the gain settings of the I-VGA and the Q-VGA, measuring a first parameter of the phase shifter in the first phase state, setting the phase shifter in a second phase state by controlling the gain settings of the I-VGA and the Q-VGA, measuring a second parameter of the phase shifter for the second phase state, and generating the mapping table based on the first parameter and the second parameter.

In certain implementations, the calibration includes measuring s-parameters of the phase shifter in a pair of phase states (for instance, 0° and 90°) and computing the delta from ideal values. The delta is used to generate corrected gain settings of the I-VGA and the Q-VGA for a particular phase shift.

FIG. 1 is a schematic diagram of one embodiment of a phased array antenna system 10 including phase shifters. The phased array antenna system 10 includes a digital processing circuit 1, a data conversion circuit 2, a channel processing circuit 3, RF front ends 5a, 5b, . . . 5n, and antennas 6a, 6b, . . . 6n. Although an example system with three RF front ends and three antennas is illustrated, the phased array antenna system 10 can include more or fewer RF front ends and/or more or fewer antennas as indicated by the ellipses. Furthermore, in certain implementations, the phased array antenna system 10 is implemented with separate antennas for transmitting and receiving signals.

The phased array antenna system 10 illustrates one embodiment of an electronic system that can include one or more phase shifters implemented in accordance with the teachings herein. However, the phase shifters disclosed herein can be used in a wide range of electronics. A phased array antenna system is also referred to herein as an active scanned electronically steered array or beamforming communication system.

As shown in FIG. 1, the channel processing circuit 3 is coupled to antennas 6a, 6b, ... 6n through RF front ends 5a, 5b, ... 5n, respectively. The channel processing circuit 3 includes a splitting/combining circuit 7, a frequency up/down conversion circuit 8, and a phase and amplitude control circuit 9, in this embodiment. The channel processing circuit 3 provides RF signal processing of RF signals transmitted by and received from each communication channel. In the illustrated embodiment, each communication channel is associated with a corresponding RF front end and antenna.

With continuing reference to FIG. 1, the digital processing circuit 1 generates digital transmit data for controlling a transmit beam radiated from the antennas 6a, 6b, ... 6n. The digital processing circuit 1 also processes digital receive data representing a receive beam. In certain implementations, the digital processing circuit 1 includes one or more baseband processors.

As shown in FIG. 1, the digital processing circuit 1 is coupled to the data conversion circuit 2, which includes digital-to-analog converter (DAC) circuitry for converting digital transmit data to one or more baseband transmit signals and analog-to-digital converter (ADC) circuitry for converting one or more baseband receive signals to digital receive data.

The frequency up/down conversion circuit 8 provides frequency upshifting from baseband to RF and frequency downshifting from RF to baseband, in this embodiment. However, other implementations are possible, such as configurations in which the phased array antenna system 10 operates in part at an intermediate frequency (IF). In certain implementations, the splitting/combining circuit 7 provides splitting to one or more frequency upshifted transmit signals to generate RF signals suitable for processing by the RF front ends 5a, 5b, ... 5n and subsequent transmission on the antennas 6a, 6b, ... 6n. Additionally, the splitting/combining circuit 7 combines RF signals received vias the antennas 6a, 6b, ... 6n and RF front ends 5a, 5b, ... 5n to generate one or more baseband receive signals for the data conversion circuit 2.

The channel processing circuit 3 also includes the phase and amplitude control circuit 9 for controlling beamforming operations. For example, the phase and amplitude control circuit 9 controls the amplitudes and phases of RF signals transmitted or received via the antennas 6a, 6b, ... 6n to provide beamforming. With respect to signal transmission, the RF signal waves radiated from the antennas 6a, 6b, ... 6n aggregate through constructive and destructive interference to collectively generate a transmit beam having a particular direction. With respect to signal reception, the channel processing circuit 3 generates a receive beam by combining the RF signals received from the antennas 6a, 6b, ... 6n after amplitude scaling and phase shifting.

Phased array antenna systems are used in a wide variety of applications including, but not limited to, mobile communications, military and defense systems, and/or radar technology.

As shown in FIG. 1, the RF front ends 5a, 5b, ... 5n each include one or more VGAs 11a, 11b, ... 11n, which are used to scale the amplitude of RF signals transmitted or received by the antennas 6a, 6b, ... 6n, respectively. Additionally, the RF front ends 5a, 5b, ... 5n each include one or more phase shifters 12a, 12b, ... 12n, respectively, for phase-shifting the RF signals. For example, in certain implementations the phase and amplitude control circuit 9 generates gain control signals for controlling the amount of gain provided by the VGAs 11a, 11, ... 11n and phase control signals for controlling the amount of phase shifting provided by the phase shifters 12a, 12b, ... 12n.

The phased array antenna system 10 operates to generate a transmit beam and/or receive beam including a main lobe pointed in a desired direction of communication. The phased array antenna system 10 realizes increased signal to noise (SNR) ratio in the direction of the main lobe. The transmit and/or receive beam also includes one or more side lobes, which point in different directions than the main lobe and are undesirable.

An accuracy of beam direction of the phased array antenna system 10 is based on a precision in controlling the gain and phases of the RF signals communicated via the antennas 6a, 6b, ... 6n. For example, when one or more of the RF signals has a large phase error, the beam can be broken and/or pointed in an incorrect direction. Furthermore, the size or magnitude of beam side lobe levels is based on an accuracy in controlling the phases and amplitudes of the RF signals.

Accordingly, it is desirable to tightly control the phase and amplitude of RF signals communicated by the antennas 6a, 6b, ... 6n to provide robust beamforming operations.

By implementing the phase shifters 12a, 12b, ... 12n in accordance with the teachings herein, beamforming operations of the phased array antenna system 10 are enhanced by providing tighter and/or more accurate control over phase of RF signals. Furthermore, implementing the phase shifters 12a, 12b, ... 12n in accordance with the teachings herein can provide wideband operation, thereby expanding the range of frequencies over which the phased array antenna system 10 can operate.

Although the phase shifters herein can be used in beamforming communications, the teachings herein are also applicable to other types of electronic systems including one or more phase shifters.

Figure 2A:
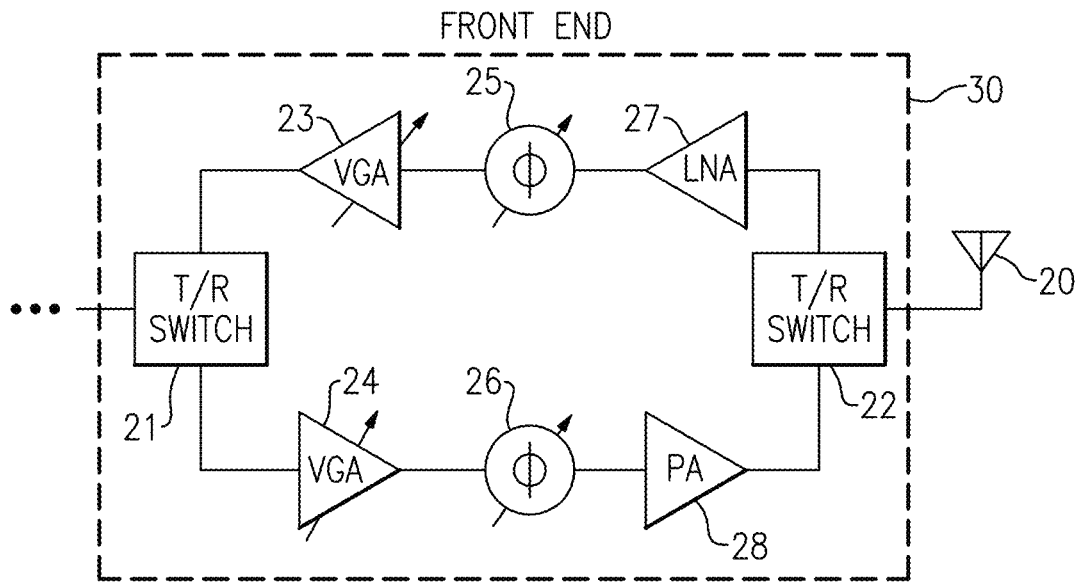
FIG. 2A is a schematic diagram of one embodiment of a front end system including phase shifters.

FIG. 2A is a schematic diagram of one embodiment of a front end system 30 including phase shifters. The front end system 30 includes a first transmit/receive (T/R) switch 21, a second transmit/receive switch 22, a receive-path VGA 23, a transmit-path VGA 24, a receive-path controllable phase shifter 25, a transmit-path phase shifter 26, a low noise amplifier (LNA) 27, and a power amplifier (PA) 28. As shown in FIG. 2A, the front end system 30 is depicted as being coupled to an antenna 20.

The front end system 30 can be included in a wide variety of RF systems, including, but not limited to, phased array antenna systems, such as the phased array antenna system 10 of FIG. 1. For example, multiple instantiations of the front end system 30 can be used to implement the RF front ends 5a, 5b, ... 5n of FIG. 1. In certain implementations, one or more instantiations of the front end system 30 are fabricated on a semiconductor die or chip.

As shown in FIG. 2A, the front end system 30 includes the receive-path VGA 23 for controlling an amount of amplification provided to an RF input signal received on the antenna 20, and the transmit-path VGA 24 for controlling an amount of amplification provided to an RF output signal transmitted on the antenna 20. Additionally, the front end system 30 includes the receive-path controllable phase shifter 25 for controlling an amount of phase shift to an RF input signal received on the antenna 20, and the transmit-path controllable phase shifter 26 for controlling an amount of phase shift provided to the RF output signal transmitted on the antenna 20.

The gain control provided by the VGAs and the phase control provided by the phase shifters can serve a wide variety of purposes including, but not limited to, compensating for temperature and/or process variation. Moreover, in beamforming applications, the VGAs and phase shifters can control side-lobe levels of a beam pattern.

RF systems, such as the front end system 30 of FIG. 2A, can include one or more phase shifters for controlling the phase provided to RF signals propagating along transmit paths and/or receive paths. Although one example of an RF system including phase shifters is shown, the teachings herein are applicable to RF systems implemented in a wide variety of ways.

Figure 2B:
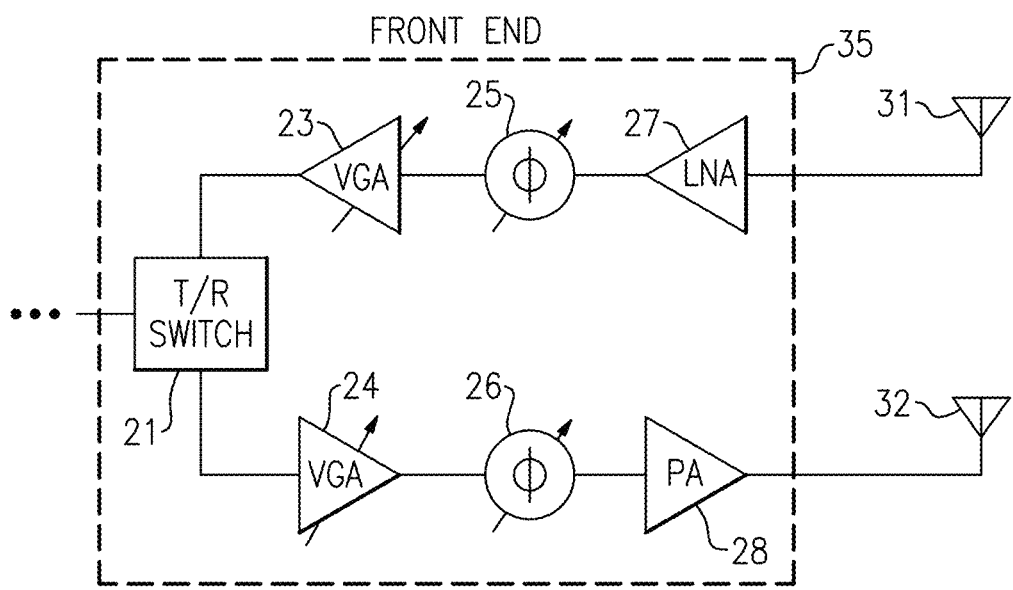
FIG. 2B is a schematic diagram of another embodiment of a front end system including phase shifters.

FIG. 2B is a schematic diagram of another embodiment of a front end system 35 including phase shifters. The front end system 35 of FIG. 2B is similar to the front end system 30 of FIG. 2A, except that the front end system 35 omits the second transmit/receive switch 22. As shown in FIG. 2B, the front end system 35 is depicted as being coupled to a receive antenna 31 and to a transmit antenna 32.

The front end system 35 operates with different antennas for signal transmission and reception. In the illustrated embodiment, the receive-path VGA 23 controls an amount of amplification provided to an RF input signal received on the receive antenna 31, and the transmit-path VGA 24 controls an amount of amplification provided to an RF output signal transmitted on the second antenna 32. Additionally, the receive-path phase shifter 25 controls an amount of phase shift provided to the RF input signal received on the receive antenna 31, and the transmit-path phase shifter 26 controls an amount of phase shift provided to an RF output signal transmitted on the second antenna 32.

Certain RF systems include separate antennas for transmission and reception of signals.

Figure 3A:
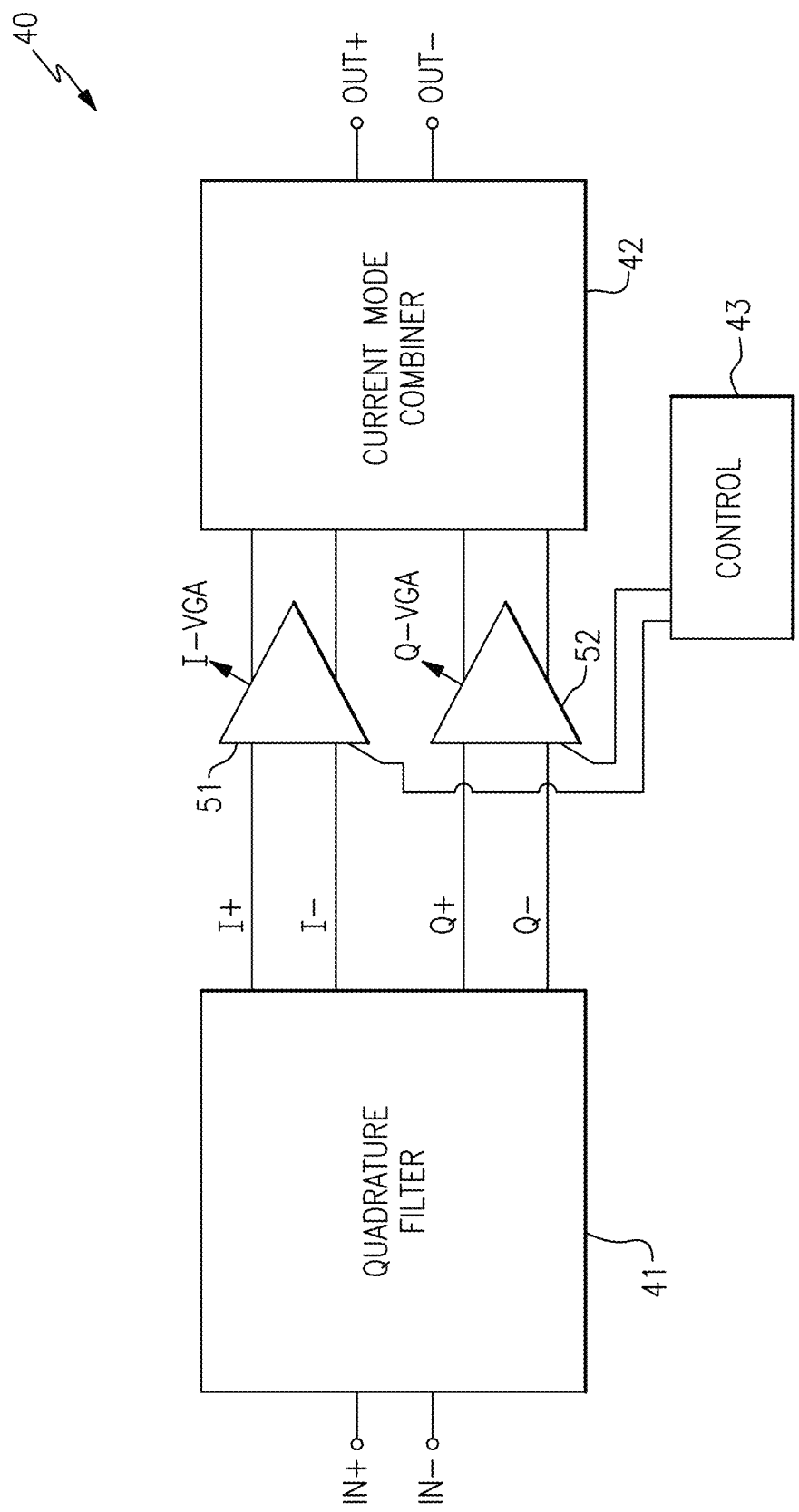
FIG. 3A is a schematic diagram of a phase shifter according to one embodiment.

FIG. 3A is a schematic diagram of a phase shifter 40 according to one embodiment. The phase shifter 40 includes a quadrature filter 41, a current mode combiner 42, a control circuit 43, an in-phase variable gain amplifier (I-VGA) 51, and a quadrature-phase variable gain amplifier (Q-VGA) 52.

As shown in FIG. 3A, the phase shifter 40 receives a differential input signal between a non-inverted input terminal IN+ and an inverted input terminal IN−. The quadrature filter 41 operates to filter the differential input signal to separate the differential input signal into a differential I voltage and a differential Q voltage. The differential I voltage includes a non-inverted component I+ and an inverted component I−, while the differential Q voltage includes a non-inverted component Q+ and an inverted component Q−. The differential I voltage and the differential Q voltage have a quadrature phase relationship, and thus a phase difference between Q+ and I+ is about 90° while a phase difference between Q− and I− is also about 90°.

The I-VGA 51 operates to amplify the differential I voltage to generate a differential I current, while the Q-VGA 52 operates to amplify the differential Q voltage to generate a differential Q current. The current mode combiner 42 combines the differential I current and the differential Q current to generate a differential output signal between a non-inverted output terminal OUT+ and an inverted output terminal OUT−.

By providing current mode summing, a number of advantages are provided, including, but not limited to, enhanced accuracy in combining I and Q signal components to generate the differential output signal.

The phase shifter 40 operates as a vector modulator, in which gain and polarity of an input signal's I component and Q component are separately controlled to provide phase shifting. The I-VGA 51 and the Q-VGA 52 have gain settings controlled by the control circuit 43. By providing control over the gain settings of the I-VGA 51 and the Q-VGA 52, a desired amount of phase shift (or difference in phase) between the differential output signal and the differential input signal can be achieved. In certain implementations, the phase shifter 40 is fabricated on a semiconductor die, and the control circuit 43 receives data for controlling the phase shift setting over a serial interface of the semiconductor die.

Figure 3B:
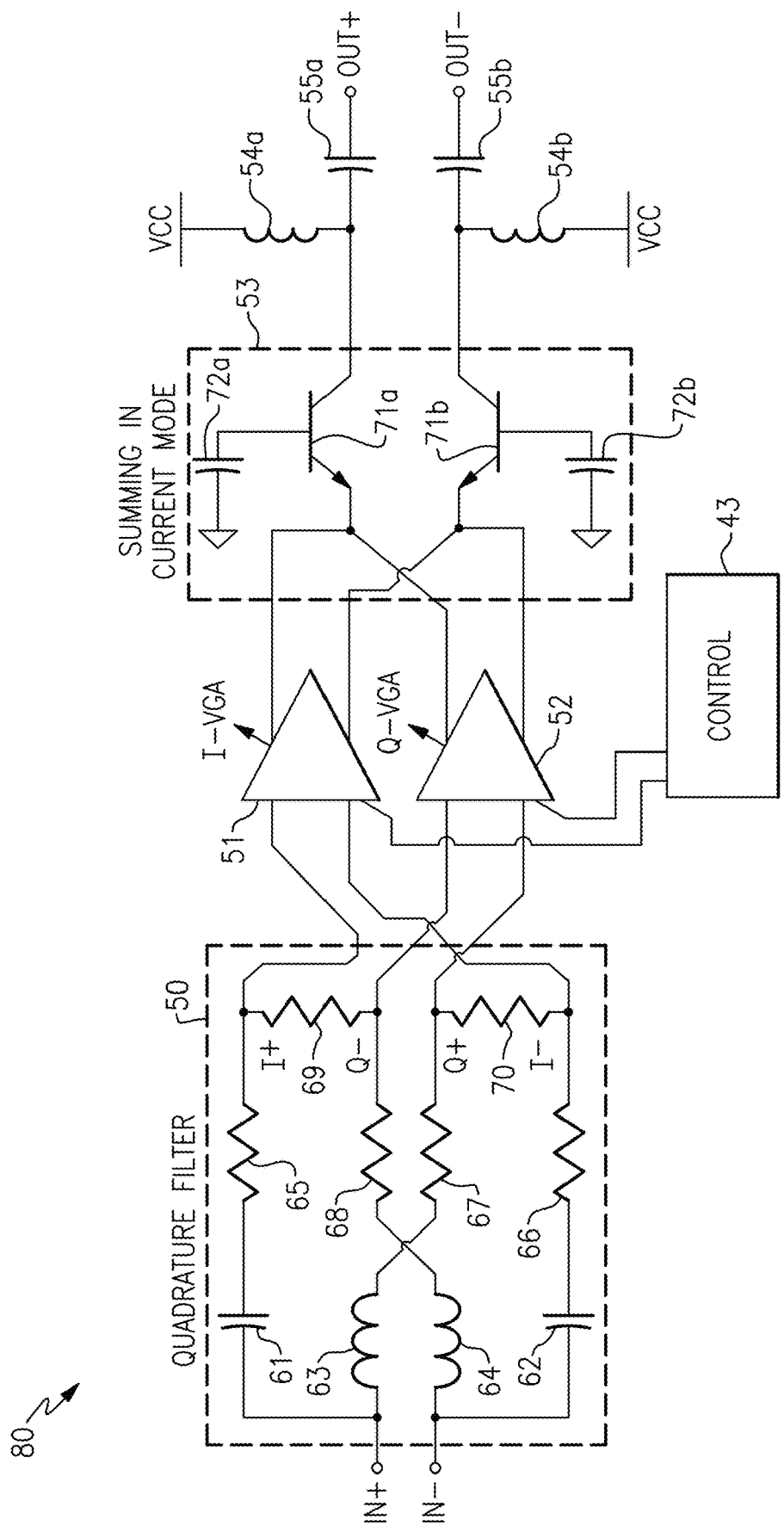
FIG. 3B is a schematic diagram of a phase shifter according to another embodiment.

FIG. 3B is a schematic diagram of a phase shifter 80 according to another embodiment. The phase shifter 80 includes a control circuit 43, a quadrature filter 50, an I-VGA 51, a Q-VGA 52, a current mode combiner 53, a first output matching inductor 54a, a second output matching inductor 54b, a first output matching capacitor 55a, and a second output matching capacitor 55b.

The phase shifter 80 provides phase shifting using vector modulation. In particular, the quadrature filter 50 splits the differential input signal into a differential I voltage and a differential Q voltage, which are separated by a phase difference of about ninety degrees. Thus, the differential I voltage and the differential Q voltage are substantially orthogonal to one another.

In the illustrated embodiment, the quadrature filter 50 includes a first series capacitor 61, a second series capacitor 62, a first series inductor 63, a second series inductor 64, a first series resistor 65, a second series resistor 66, a third series resistor 67, a fourth series resistor 68, a first shunt resistor 69, and a second shunt resistor 70. The quadrature filter 50 further includes a first input and a second input for receiving the non-inverted component and the inverted component IN−, respectively, of the differential input signal. Furthermore, the quadrature filter 50 further includes a non-inverted I output and an inverted I output for providing the non-inverted component I+ and the inverted component I−, respectively, of the differential I voltage, and a non-inverted Q output and an inverted Q output for providing the non-inverted component Q+ and the inverted component Q−, respectively, of the differential Q voltage.

As shown in FIG. 3B, the first series capacitor 61 and the first series resistor 65 are connected in series between the non-inverted input and the non-inverted I output, while the second series capacitor 62 and the second series resistor 66 are connected in series between the inverted input and the inverted I output. Additionally, the first series inductor 63 and the third series resistor 67 are connected in series between the non-inverted input and the non-inverted Q output, while the second series inductor 64 and the fourth series resistor 68 are connected in series between the inverted input and the inverted Q output. The first shunt resistor 69 is connected across the non-inverted I output and the inverted Q output, and the second shunt resistor 70 is connected across the non-inverted Q output and the inverted I output.

Although one embodiment of a quadrature filter is depicted, the teachings herein are applicable to phase shifters including quadrature filters implemented in a wide variety of ways.

As shown in FIG. 3B, the differential I voltage is amplified by the I-VGA 51 to generate a differential I current that is scaled based on a gain setting of the I-VGA 51. Additionally, the differential Q voltage is amplified by the Q-VGA 52 to generate a differential Q current that is scaled based on a gain setting of the Q-VGA 52. The gain settings for the I-VGA 51 and the Q-VGA 52 are controlled by the control circuit 43.

With continuing reference to FIG. 3B, the differential I current and the differential Q current are combined using the current mode combiner 53 to generate a differential output signal corresponding to a phase shifted version of the differential input signal. By changing the gain settings of the I-VGA 51 and the Q-VGA 52, the phase of the differential output signal can be changed.

In the illustrated embodiment, the current mode combiner 53 includes a first bipolar transistor 71a, a second bipolar transistor 71b, a first base capacitor 72a, and a second base capacitor 72b. Additionally, a non-inverted current output of the I-VGA 51 and an inverted current output of the Q-VGA 52 are connected to an emitter of the first bipolar transistor 71a. Additionally, an inverted current output of the I-VGA 51 and a non-inverted current output of the Q-VGA 52 are connected to an emitter of the second bipolar transistor 71b. Furthermore, the first base capacitor 72a is connected between a base of the first bipolar transistor 71a and ground, and the second base capacitor 72b is connected between a base of the second bipolar transistor 71b and ground.

With continuing reference to FIG. 3B, a collector of the first bipolar transistor 71a is connected to the non-inverted output terminal OUT+ through the first output matching capacitor 55a, while a collector of the second bipolar transistor 71b is connected to the inverted output terminal OUT− through the second output matching capacitor 55b. Additionally, the first output matching inductor 54a is connected between the collector of the first bipolar transistor 71a and a power supply VCC, while the second output matching inductor 54b is connected between the collector of the second bipolar transistor 71b and the power supply VCC.

In the illustrated embodiment, the differential I current from the I-VGA 51 and the differential Q current from the Q-VGA 52 are summed in current mode and fed to a differential common-base stage (implemented differentially using bipolar transistors 71a and 71b and base capacitors 72a and 72b, in this example) followed by an LC matching network at the output.

Including the differential common-base stage (or a differential common-gate stage) helps to reduce parasitic capacitance at the output to provide wideband operation. The low input impedance of the differential common-base stage (or a differential common-gate stage) also helps to reduce inaccuracies due to varying VGA output impedance with changing gain.

Figure 3C:
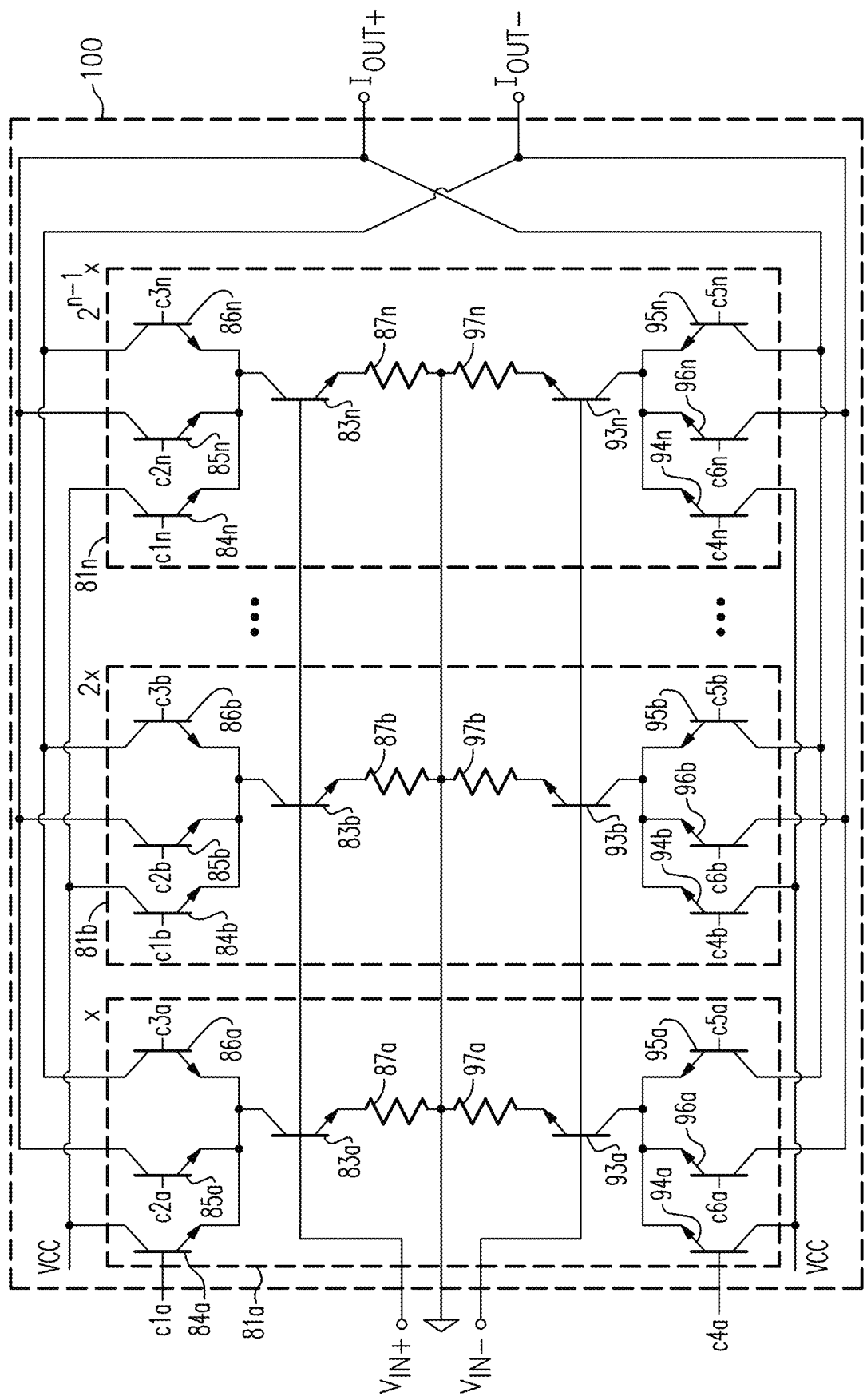
FIG. 3C is a schematic diagram of one embodiment of a variable gain amplifier (VGA) for a phase shifter.

FIG. 3C is a schematic diagram of one embodiment of a VGA 100 for a phase shifter. The VGA 100 can be used, for example, to implement the I-VGA or the Q-VGA of a vector modulator phase shifter. For example, two instantiations of the VGA 100 can be used to implement the I-VGA 51 and the Q-VGA 52 shown in FIGS. 3A and 3B. Although one embodiment of a VGA is shown, the teachings herein are applicable to phase shifters including VGAs implemented in a wide variety of ways.

In the illustrated embodiment, the VGA 100 includes a non-inverted voltage input $V_{IN+}$ and an inverted voltage input $V_{IN-}$ for receiving a differential input voltage. Additionally, the VGA 100 includes a non-inverted current output $I_{OUT+}$ and an inverted current output $I_{OUT-}$ for providing a differential output current. The VGA 100 further includes differential transconductance stages 81a, 81b, . . . 81n for amplifying the differential input voltage to generate the differential output current. The VGA 100 further receives various control bits provided from a control circuit (for instance, the control circuit 43 of FIGS. 3A and 3B) to set the VGA's gain setting.

Thus, the VGA 100 includes multiple transconductance ($g_m$) stages that operate in parallel with one another to convert the different input voltage (corresponding to a differential I voltage or a differential Q voltage) to a differential output current (corresponding to a differential I current or a differential Q current).

Although shown as including three $g_m$ stages, the VGA 100 can include more or fewer $g_m$ stages as indicated by the ellipses. For example, in certain implementations, the VGA 100 includes five or more $g_m$ stages.

In certain implementations, the $g_m$ stages are binary weighted, for instance, by scaling the transistor widths of the $g_m$ stages. In one example, five $g_m$ stages are included such that the first $g_m$ stage has weight x, the second $g_m$ stage has weight 2x, the third $g_m$ stage has weight 4x, the fourth $g_m$ stage has weight 8x, and the fifth $g_m$ stage has weight 16x. Although a binary weighting scheme (x, 2x, . . . $2^{n-1}$x) is depicted in FIG. 3C, the VGA 100 can be implemented with other sizing of $g_m$ stages.

As shown in FIG. 3C, the transconductance stage 81a includes a first amplification transistor 83a, a first supply steering transistor 84a, a first non-inverted output steering transistor 85a, a first inverted output steering transistor 86a, a first degeneration resistor 87a, a second amplification transistor 93a, a second supply steering transistor 94a, a second non-inverted output steering transistor 95a, a second inverted output steering transistor 96a, and a second degeneration resistor 97a.

Aside from scaling, the transconductance stage 81b and the transconductance stage 81n are implemented with similar components as the transconductance stage 81a, in this embodiment. For example, the transconductance stage 81b includes a first amplification transistor 83b, a first supply steering transistor 84b, a first non-inverted output steering transistor 85b, a first inverted output steering transistor 86b, a first degeneration resistor 87b, a second amplification transistor 93b, a second supply steering transistor 94b, a second non-inverted output steering transistor 95b, a second inverted output steering transistor 96b, and a second degeneration resistor 97n. Furthermore, the second transconductance stage 81n includes a first amplification transistor 83n, a first supply steering transistor 84n, a first non-inverted output steering transistor 85n, a first inverted output steering transistor 86n, a first degeneration resistor 87n, a second amplification transistor 93n, a second supply steering transistor 94n, a second non-inverted output steering transistor 95n, and a second inverted output steering transistor 96n, and a second degeneration resistor 97n.

The first amplification transistor 83a amplifies a non-inverted voltage receive from the non-inverted voltage input $V_{IN+}$ to generate a first stage current that can be steered to the supply voltage $V_{CC}$, the non-inverted current output $I_{OUT+}$, or the inverted current output $I_{OUT-}$. As shown in FIG. 3C, control bits c1a, c2a, and c3a, respectively, are used to control the first supply steering transistor 84a, the first non-inverted output steering transistor 85a, and the first inverted output steering transistor 86a to steer the first stage current as desired based on the VGA's gain setting indicated by the control bits. Likewise, the second amplification transistor 93a amplifies an inverted voltage received from the inverted voltage input $V_{IN-}$ to generate a second stage current that can be steered to the supply voltage VCC, the non-inverted current output $I_{OUT+}$, or the inverted current output $I_{OUT-}$ based on the control bits c4a, c5a, and c6a, respectively. As shown in FIG. 3C, control bits c1b, c2b, c3b, c1n, c2n, c3n, c4b, c5b, c5n, c6b, c6n provide similar steering control for the transconductance stage 81b and the transconductance stage 81n.

By implementing the VGA 100 with current steering, the VGA 100 operates with substantially constant transistor current density of the amplification transistors 83a, 83b, . . . 83n, 93a, 93b, . . . 93n used as transconductance devices in the $g_m$ stages. Implementing the VGA 100 in this manner aids in providing very low phase and gain error performance.

In certain embodiments, two instantiations of the VGA 100 are used to implement an I-VGA and a Q-VGA of a phase shifter. For example, when incorporated into the phase shifter 80 of FIG. 3B, the output currents from the I-VGA 51 and the Q-VGA 52 are summed in the current mode into a low impedance node.

The VGA 100 includes current switching transistors associated with each of the $g_m$ stages. In the illustrated embodiment, the current switching transistors are digitally controlled (turned on or off) based on the selected gain setting of the VGA 100. Additionally, the current of a particular $g_m$ stage is either steered to the differential output terminals or to a supply voltage $V_{CC}$ based on the gain setting.

Advantageously, each transconductance stages 81a, 81b, . . . 81n can provide an output current to either the non-inverted current output $I_{OUT+}$ or the inverted current output $I_{OUT-}$, thereby providing flexibility with respect to controlling output signal polarity. For example, when implemented into an I-VGA and a Q-VGA of a phase shifter, the phase shifter can provide phase shifting over a full 360 range.

Thus, digital control allows selection of an active number of $g_m$ stages, thereby controlling the amount of gain or level of current scaling provided by the VGA 100. Additionally, digital control allows selection of the polarity of the output (the sign of the output current).

Figure 5:
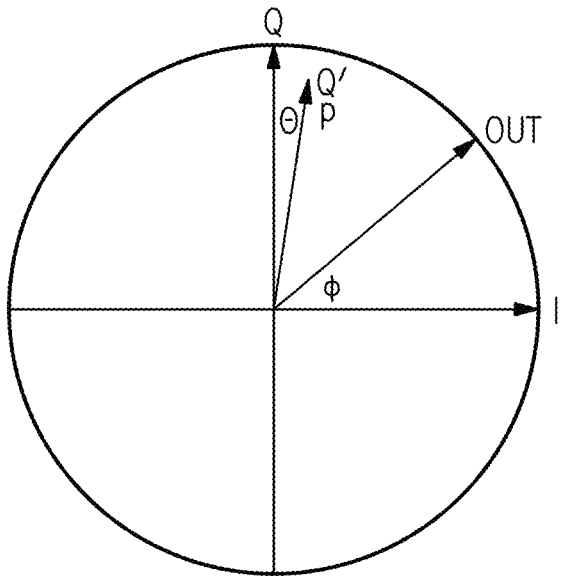
FIG. 5 is a plot of one example of non-ideal I and Q vectors for a phase shifter.

Controlling both gain and polarity in this manner enables operation in all four phase quadrants of an I versus Q plot (see, for example, FIG. 5). In certain implementations, five $g_m$ stages are included, with 5 bits used for changing the amplitude from zero to full-scale and 1 bit used for controlling the sign or polarity of the output current.

In the illustrated embodiment, all the active transistors in the signal path of the VGA 100 operate at a constant current density, irrespective of the gain setting. This translates to more uniform performance over various phase settings as compared to an implementation in which bias current is scaled to change the I and Q weights.

Moreover, this approach also allows the phase shifter to maintain substantially constant phase shift up to about the 1 dB compression point (P1 dB), whereas the bias current-scaled implementations suffer from significant phase distortion (AM/PM) for certain phase settings, such as when the bias current gets small.

Figure 4:
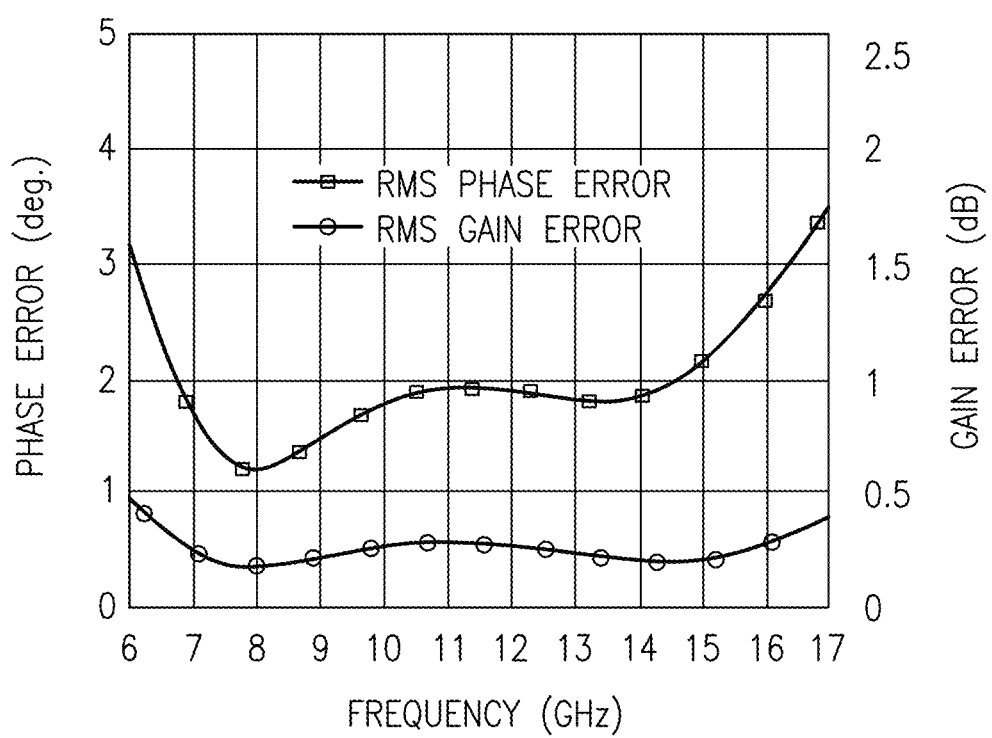
FIG. 4 is a graph of one example of gain error and phase error versus frequency for a phase shifter implemented with 7-bit precision.

FIG. 4 is a graph of one example of gain error and phase error versus frequency for a phase shifter implemented with 7-bit precision.

The graph illustrates example root mean square (RMS) phase and gain errors over all phase states for 7-bit precision versus frequency. RMS phase error stays below 2° for most of the frequency range and RMS gain error is less than 0.3 dB.

FIG. 5 is a plot of one example of non-ideal I and Q vectors for a phase shifter. The plot represents possible I-Q errors for a phase shifter.

Ideally, the I and Q vectors are perfectly orthogonal to each other and assumed to have magnitude of one. Without any loss of generality, the imperfections were assumed to affect only the Q vector, resulting in Q' with an amplitude of p and a phase error of θ.

The non-ideal vector Q' can be decomposed into an orthogonal set of vectors by decomposing Q' along I and Q. In particular, the decomposition can be (1+p*sin θ) along I and (p*cos θ) along Q. Equations 1 and 2 below assume the output vector has an amplitude of A and the desired phase angle is φ, where x and y are the weights for I and Q.

$$A \cos(\varphi) = x + p \sin(\theta) y \qquad \text{Equation 1}$$

$$A \sin(\varphi) = p \cos(\theta) y \qquad \text{Equation 2}$$

The maximum value of A for uniform gain is provided by Equation 3 below, where min is the minimum of the two indicated terms.

$$A_{max} = \min(p \cos(\theta), 1 - p \sin(\theta)) \qquad \text{Equation 3}$$

Solving the previous set of equations results in the weights as a function of desired phase and the quadrature errors, as shown by Equations 4 and 5 below.

$$x = A \cos(\varphi)(1 - \tan(\theta)\tan(\varphi)) \qquad \text{Equation 4}$$

$$y = A \sin(\varphi) \frac{1}{p \cos(\theta)}$$

In certain implementations herein, the values of p and θ are obtained by measuring the s-parameters of a phase shifter in a pair of phase states (for instance, 0° and 90°) and computing the delta from ideal values.

One example application of this approach is provided below with reference to FIGS. 6-10. In this implementation, the magnitudes of I and Q weights are controlled by two n-bit words (for instance, 5-bit) and another two bits control the signs of the vectors. This phase shifter was designed to operate over a wide bandwidth covering 6 to 18 GHz. The response of the quadrature generator varies over frequency.

Figure 6:
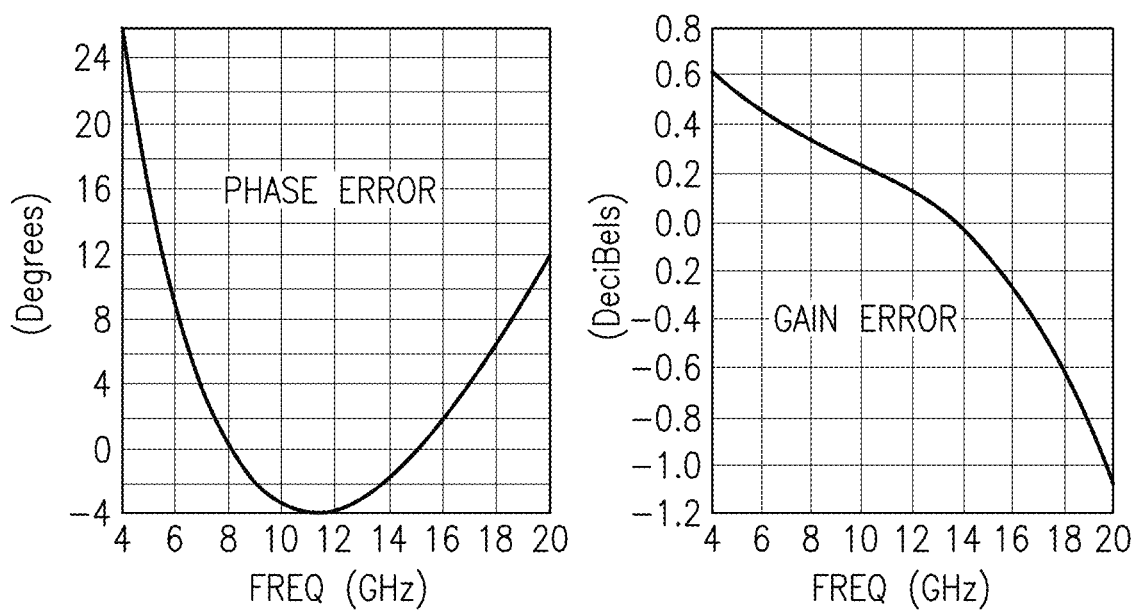
FIG. 6 is a graph of one example of gain error and phase error versus frequency arising from a quadrature generator.

The graph of FIG. 6 illustrates one example of frequency dependent I-Q error arising from a quadrature generator.

The digital bits are derived from the I-Q weights using equations 6, 7, 8, and 9 as provided below, where dec2bin[ ] is the decimal to binary function, round( ) is the integer rounding function, and n is word length (for instance, 5).

$$I_{mag} = \text{dec2bin}[|\text{round}(x(2^{n-1}-1))|] \qquad \text{Equation 6}$$

$$Q_{mag} = \text{dec2bin}[|\text{round}(y(2^{n-1}-1))|] \qquad \text{Equation 7}$$

$$I_{pol} = 0 \text{ if } x \geq 0, 1 \text{ if } x < 0 \qquad \text{Equation 8}$$

$$Q_{pol} = 0 \text{ if } y \geq 0, 1 \text{ if } y < 0 \qquad \text{Equation 9}$$

Figure 7:
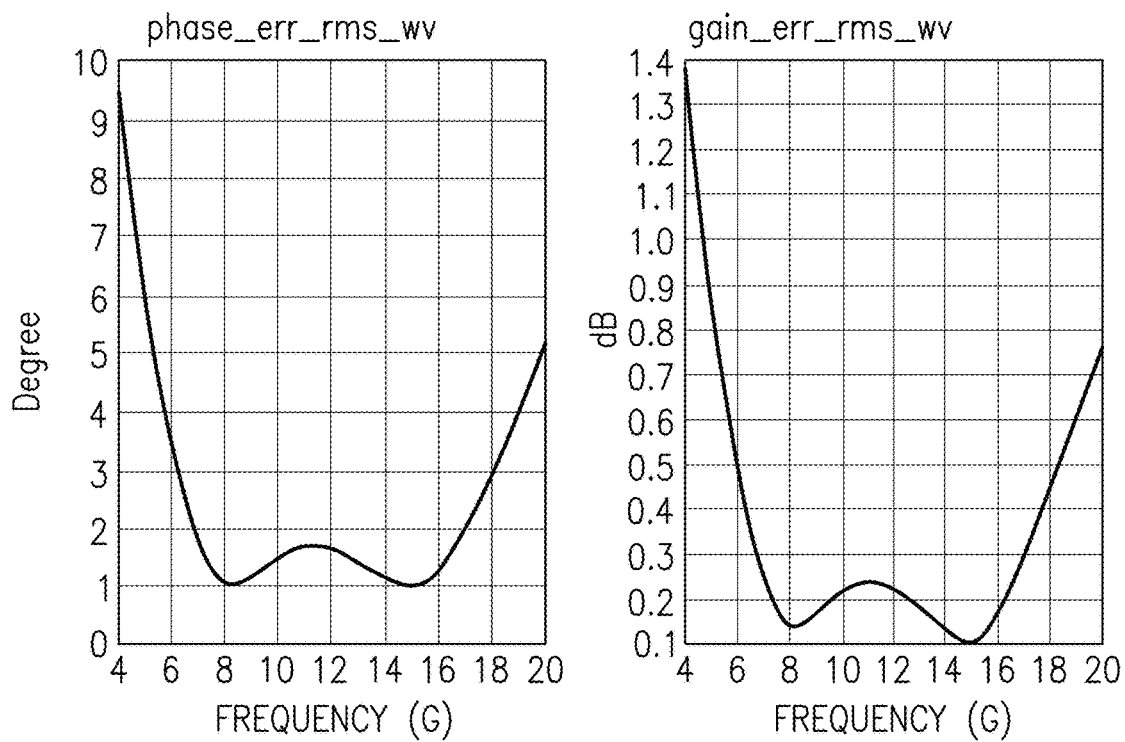
FIG. 7 is a graph of one example of gain error and phase error versus frequency for a phase shifter.

The graph of FIG. 7 depicts phase and gain error performance of the phase shifter under nominal settings of the phase shifter.

Using the approach outlined above, the accuracy of the phase shifter can be improved at a particular frequency by correcting for the I-Q errors at a desired frequency.

Figure 8:
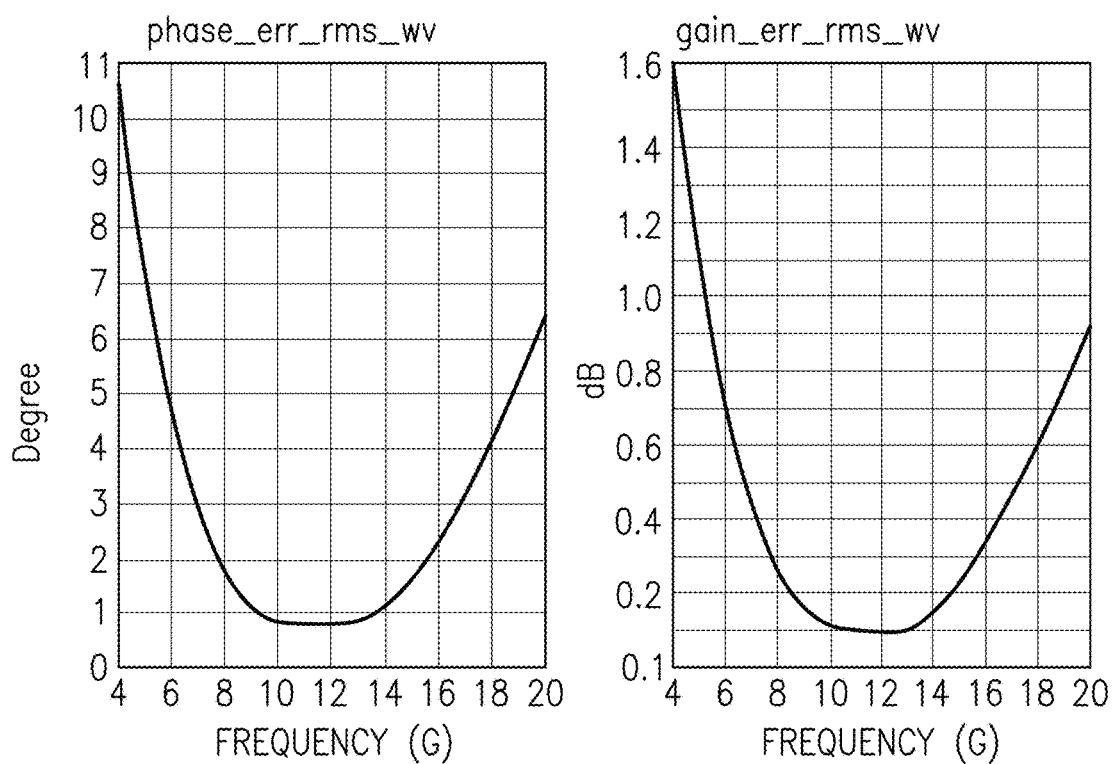
FIG. 8 is a graph of one example of gain error and phase error versus frequency for a phase shifter after calibration to 12 GHz.

Performance with settings calibrated for 12 GHz are shown in FIG. 8.

Figure 9:
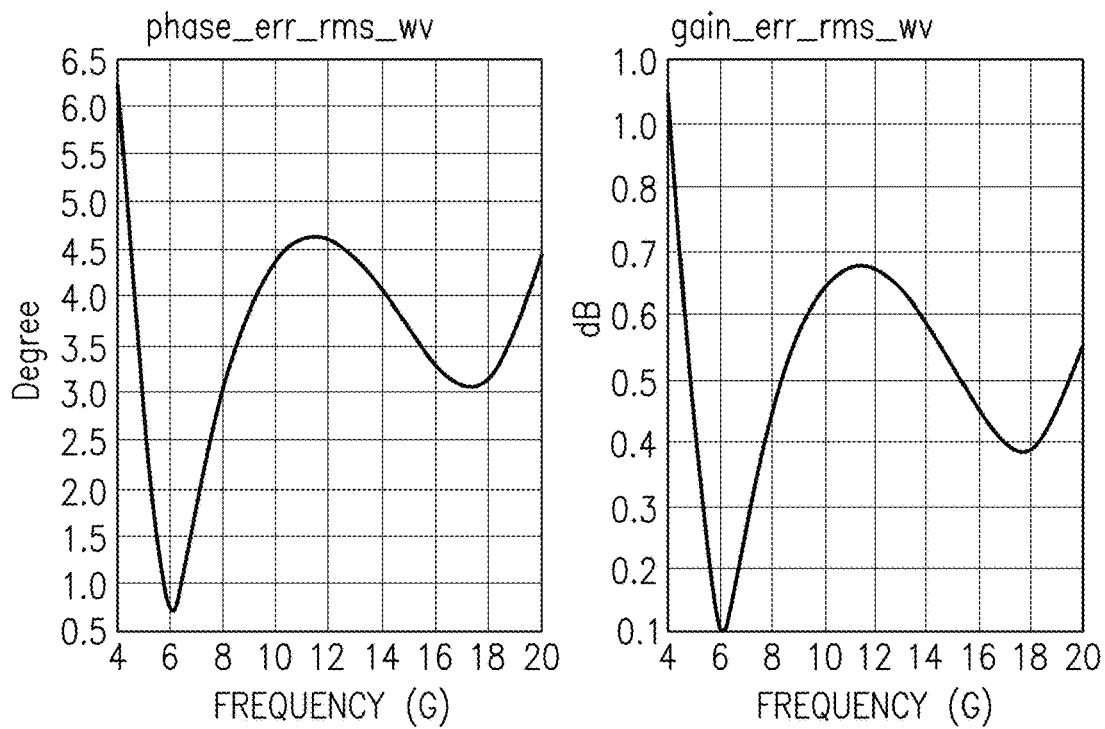
FIG. 9 is a graph of one example of gain error and phase error versus frequency for a phase shifter after calibration to 6 GHz.

Performance with settings calibrated for 6 GHz are shown in FIG. 9.

Figure 10:
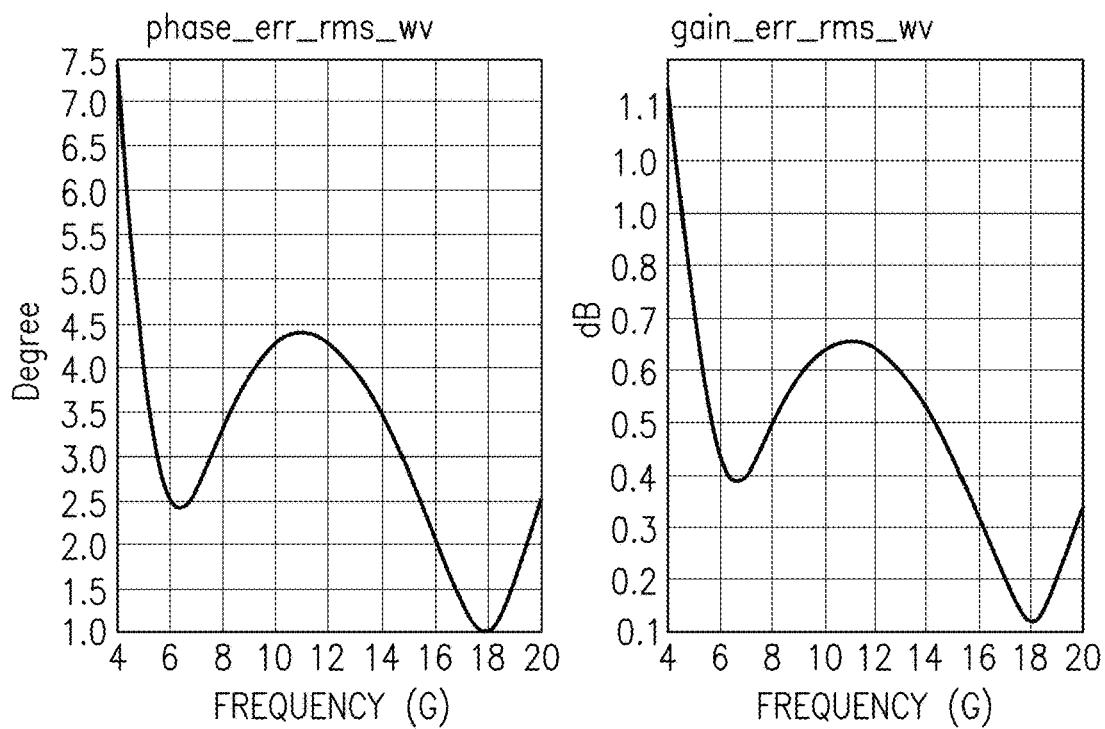
FIG. 10 is a graph of one example of gain error and phase error versus frequency for a phase shifter after calibration to 18 GHz.

Performance with settings calibrated for 18 GHz are shown in FIG. 10.

A similar technique can be used to compensate for I-Q errors induced by process imperfections as well. The tradeoff is slight reduction in gain of the phase shifter.

In certain implementations herein, a mapping table is used to convert digital gain settings of a phase shifter's VGAs to calibrated gain settings. The calibrated gain settings can be used to achieve enhanced performance of the phase shifter at a particular frequency and/or to compensate for process, voltage, and/or temperature (PVT) variation. In certain implementations, the mapping changes based on an operating frequency of the phase shifter, and thus the VGA gain settings for a given phase shift can dynamically change over time (for example, to compensate for I/Q imbalance) as operating frequency changes.

Although various examples of simulation results have been shown, simulation or measurement results can vary based on a wide variety of factors, such as simulation models, simulation tools, simulation parameters, measurement conditions, fabrication technology, and/or implementation details. Accordingly, other results are possible.

Figure 11A:
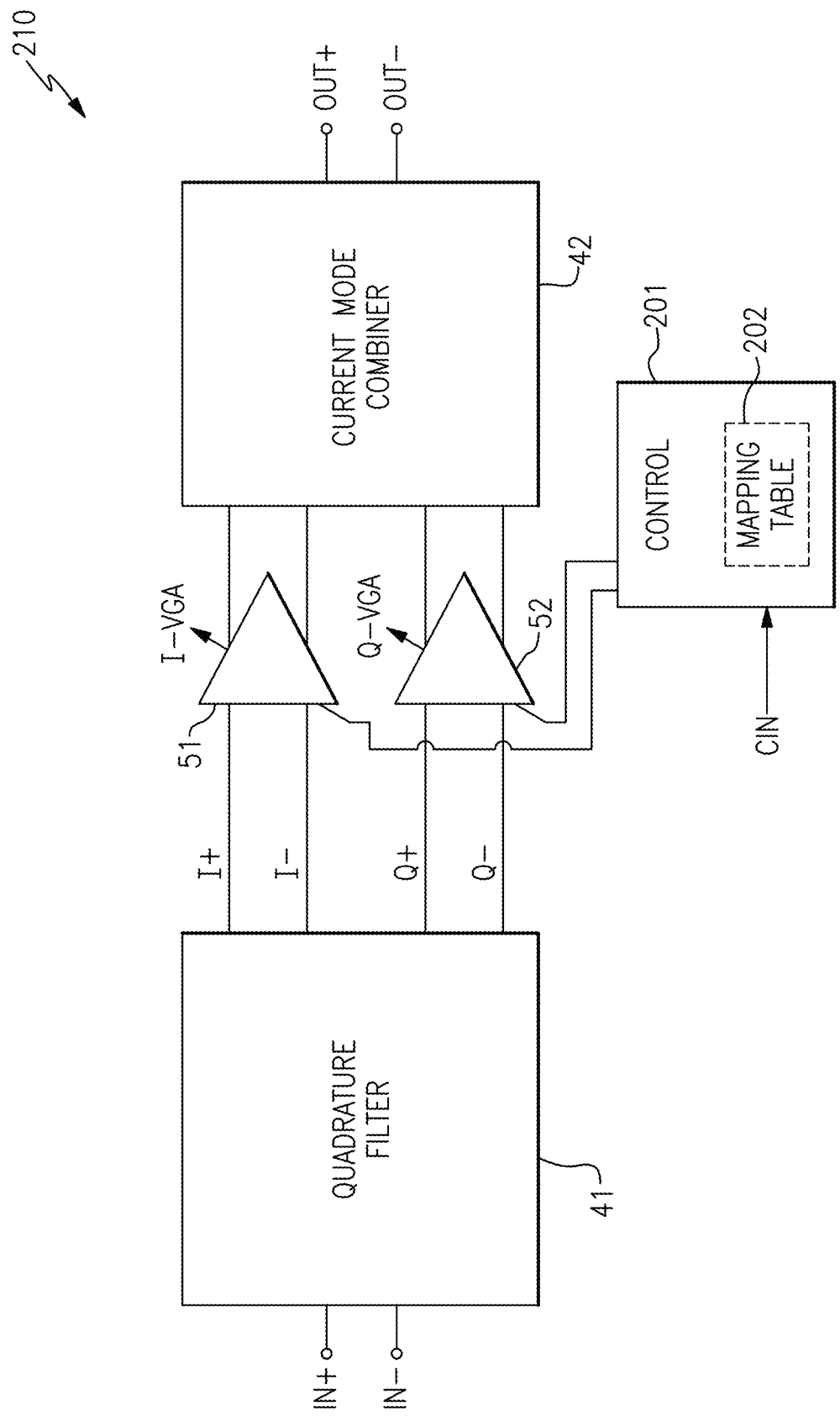
FIG. 11A is a schematic diagram of a phase shifter according to another embodiment.

FIG. 11A is a schematic diagram of a phase shifter 210 according to another embodiment. The phase shifter 210 includes a quadrature filter 41, a current mode combiner 42, a control circuit 201, an I-VGA 51, and a Q-VGA 52.

The phase shifter 210 of FIG. 11A is similar to the phase shifter 40 of FIG. 3A, except that the phase shifter 210 includes a mapping table 202 in the control circuit 201. By including the mapping table 202, the desired phase setting indicated by the input control signal CIN can be mapped to corresponding gain settings of the I-VGA 51 and the Q-VGA 52 that compensate the phase shifter 210 for I/Q imbalance, performance at a particular frequency, and/or for PVT variation.

Figure 11B:
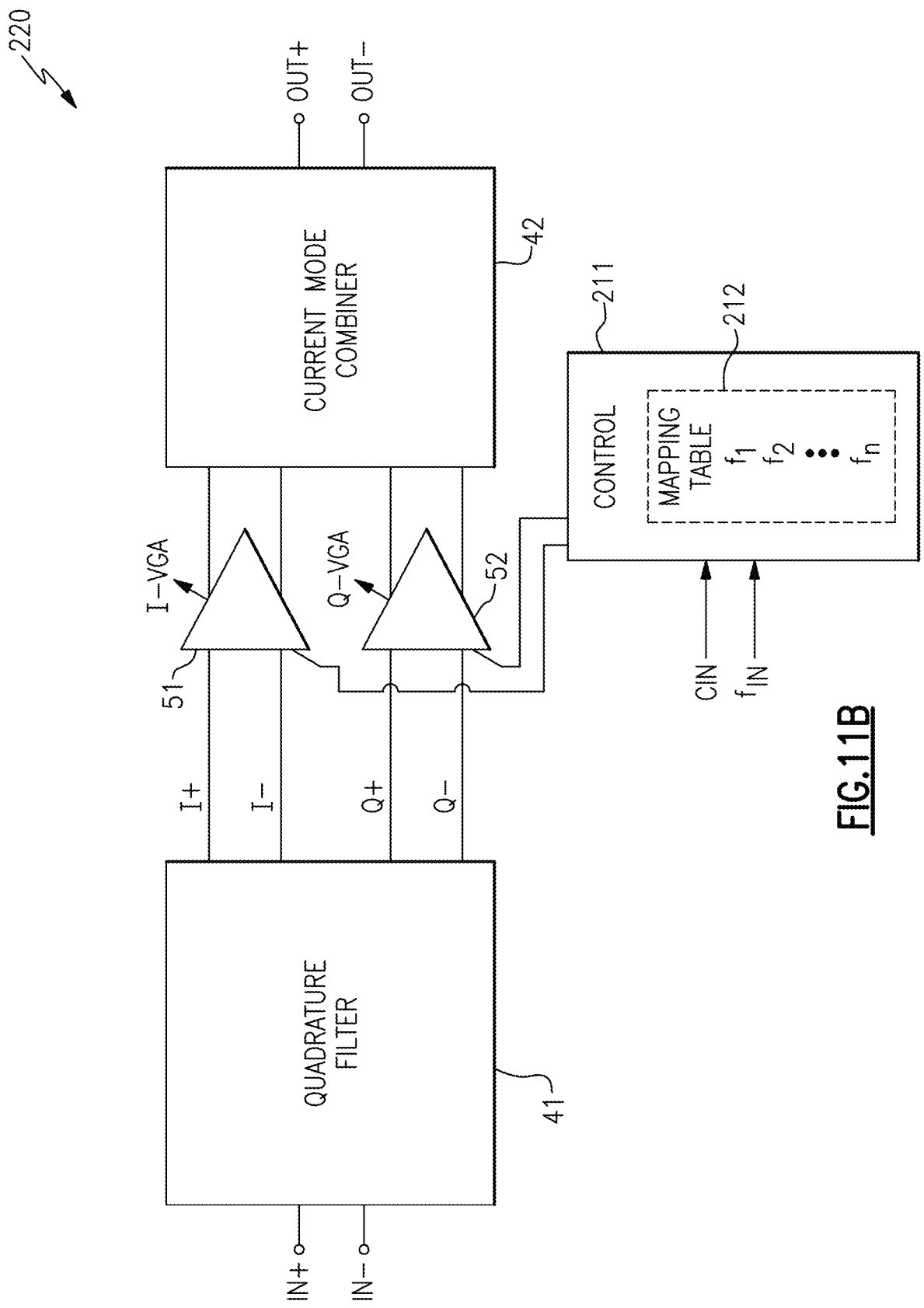
FIG. 11B is a schematic diagram of a phase shifter according to another embodiment.

FIG. 11B is a schematic diagram of a phase shifter 220 according to another embodiment. The phase shifter 220 includes a quadrature filter 41, a current mode combiner 42, a control circuit 211, an I-VGA 51, and a Q-VGA 52.

The phase shifter 220 of FIG. 11B is similar to the phase shifter 210 of FIG. 11A, except that the phase shifter 220 includes a mapping table 212 in the control circuit 211 that not only maps based on the desired phase shift, but also based on operating frequency $f_{in}$. For example, the phase shifter 220 can map based on mapping data relating gain settings of the I-VGA 51 and the Q-VGA 52 not only for different values of phase shift, but also based on different operating frequencies $f_1, f_2, \ldots f_n$.

Figure 11C:
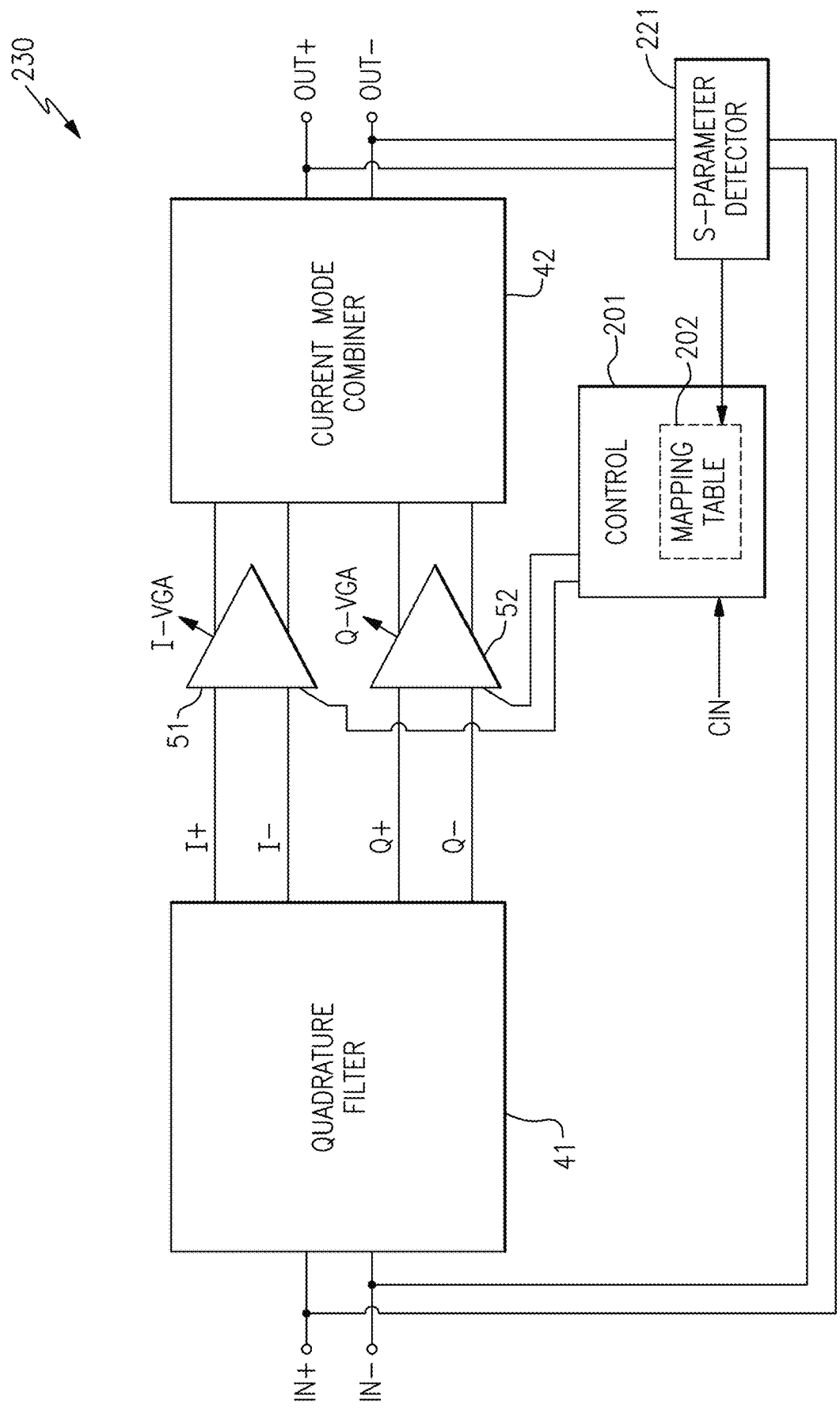
FIG. 11C is a schematic diagram of one embodiment of a phase shifter calibrated based on measurements from an s-parameter detector.

FIG. 11C is a schematic diagram of a phase shifter 230 according to another embodiment. The phase shifter 230 includes a quadrature filter 41, a current mode combiner 42, a control circuit 201, an I-VGA 51, and a Q-VGA 52, and is coupled to an s-parameter detector 221.

The phase shifter 230 of FIG. 11C is similar to the phase shifter 210 of FIG. 11A, except that the phase shifter 230 receives measurement data indicating measured s-parameter values from the s-parameter detector 221, which is coupled to the input terminals IN+, IN− and output terminals OUT+, OUT−. During calibration, the control circuit 201 operates the phase shifter 230 with different phase settings (for instance, 0° and 90°) and the measured s-parameters of the phase shifter 230 for these settings are compared to ideal values to determine a delta used in calibrating the mapping table 202. In certain implementations, the control circuit 201 includes digital processing logic and a memory for generating the mapping table 202 based on the measurements.

Any of the phase shifters herein can include or be coupled to an s-parameter detector for helping calibrate a mapping table of a phase shifter. In certain implementations, the s-parameter detector corresponds to external measurement equipment, such as test equipment.

Figure 11D:
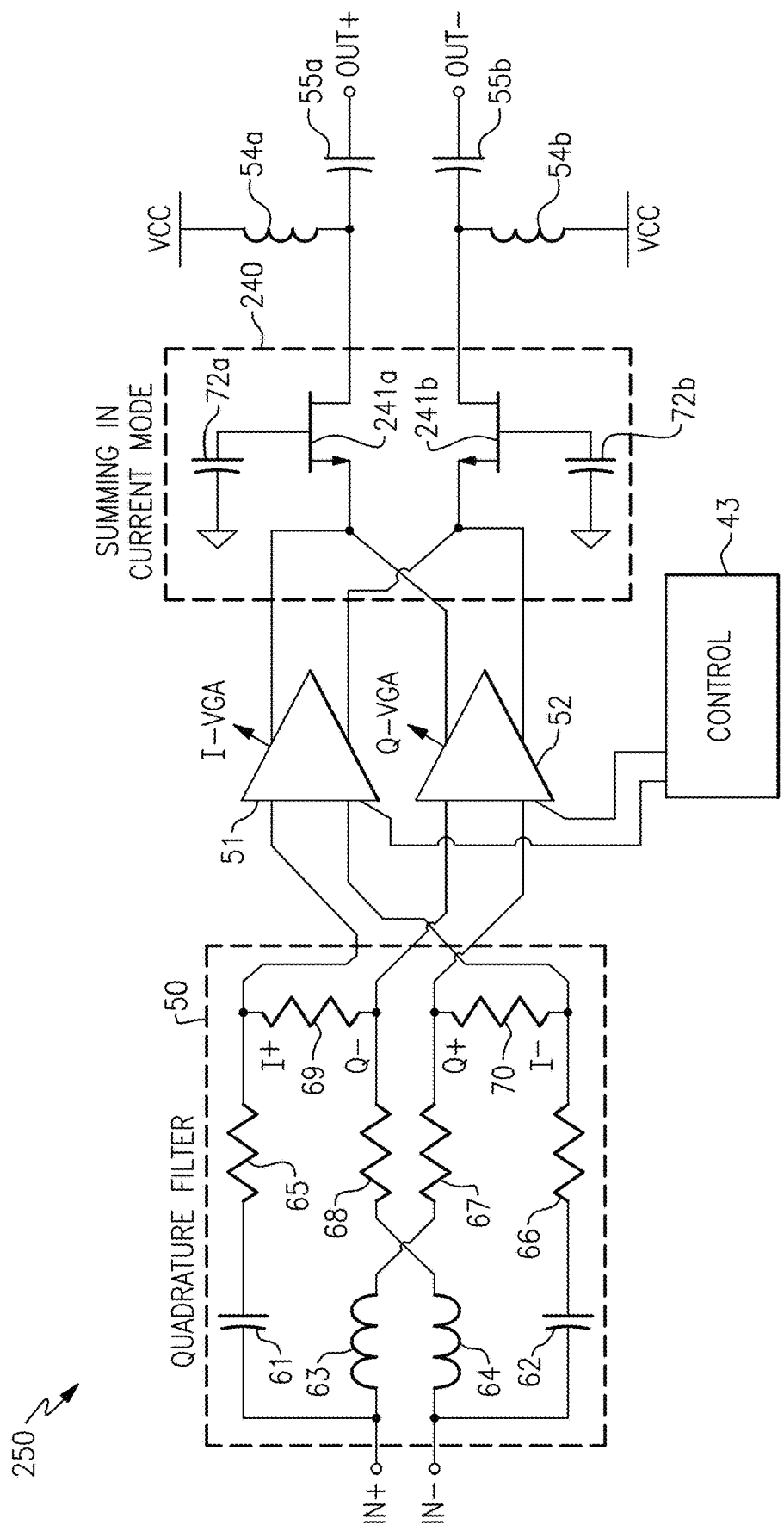
FIG. 11D is a schematic diagram of a phase shifter according to another embodiment.

FIG. 11D is a schematic diagram of a phase shifter 250 according to another embodiment. The phase shifter 250 includes a quadrature filter 50, a current mode combiner 240, a control circuit 43, an I-VGA 51, and a Q-VGA 52.

The phase shifter 250 of FIG. 11D is similar to the phase shifter 80 of FIG. 3B, except that the current mode combiner 240 of FIG. 11D is implemented with field-effect transistors (FETs) rather than bipolar transistors. In particular, the current mode combiner 240 includes a first gate capacitor 72a, a second gate capacitor 72b, a first FET 241a, and a second FET 242a arranged as a common-gate stage.

Figure 12:
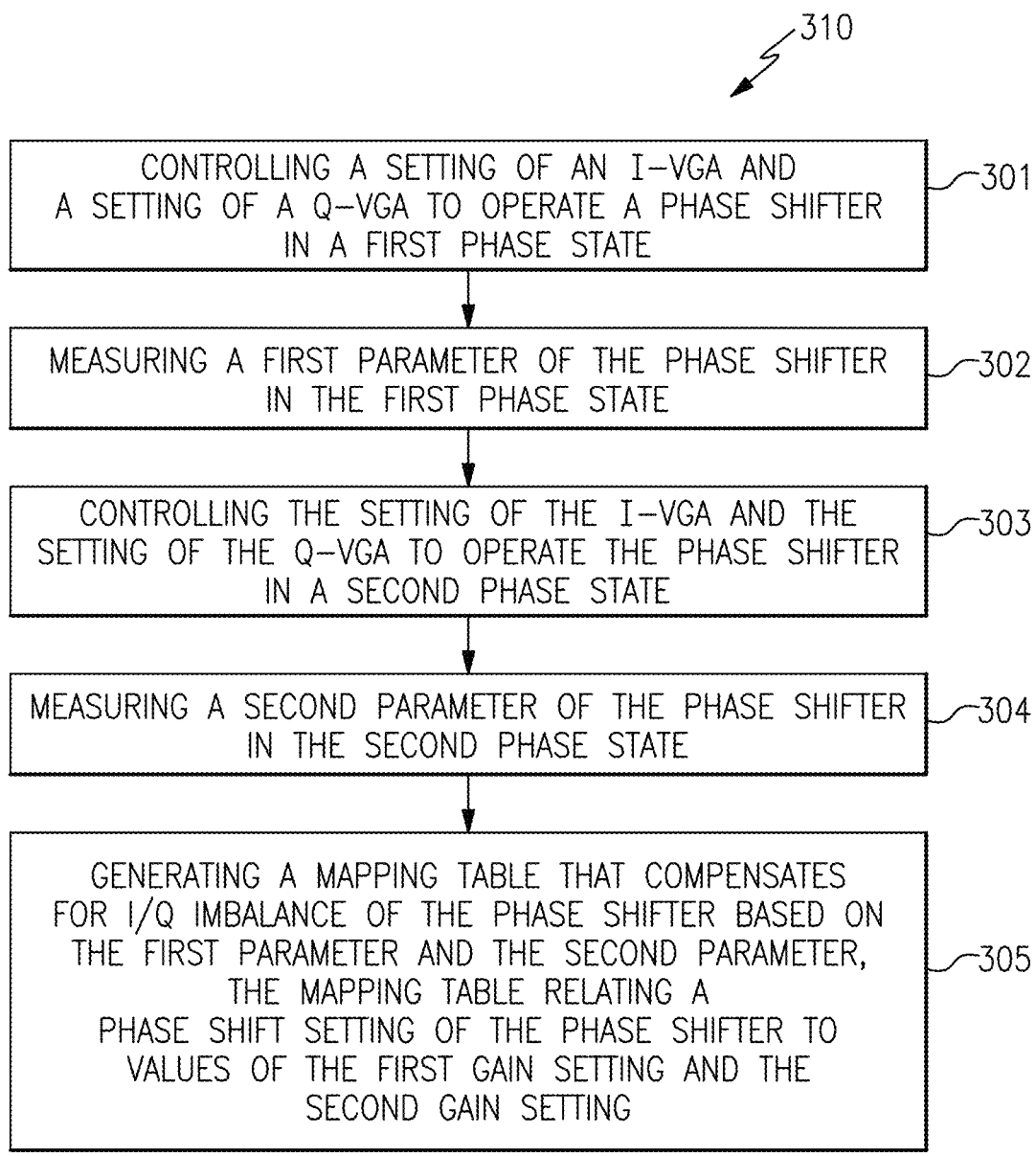
FIG. 12 is a flow chart depicting a method of calibrating a phase shifter according to one embodiment.

FIG. 12 is a flow chart depicting a method 310 of calibrating a phase shifter according to one embodiment. The method 310 can be performed using a wide variety of structures, including, but not limited to, the phase shifter 230 of FIG. 11C.

The method 310 begins at a step 301, in which a setting of an I-VGA and a setting of a Q-VGA are controlled to operate the phase shifter in a first phase state. The method continues to a step 302, in which a first parameter of the phase shifter is measured in the first phase state.

In certain implementations, the first parameter corresponds to an s-parameter measured by an s-parameter detector (for instance, the s-parameter detector 221 of FIG. 11C).

The method 310 continues to a step 303, in which the setting of the I-VGA and the setting of the Q-VGA are controlled to operate the phase shifter in a second phase state. The method continues to a step 304, in which a second parameter of the phase shifter is measured in the second phase state.

In certain implementations, the first phase state and the second phase state are separated by about ninety degrees. For instance, in one example, the first phase state provides a phase shift of about 0° and the second phase state provides a phase shift of about 90°, or vice versa.

The measured parameters can correspond to a wide variety of parameters. In certain implementations, the first parameter and the second parameter are s-parameters, where s is the complex frequency variable associated with the Laplace transform.

The method 310 continues to a step 305, in which a mapping table that compensates for I/Q imbalance of the phase shifter is generated based on the first parameter and the second parameter. The mapping table relates a phase shift setting of the phase shifter to values of the first gain setting and the second gain setting.

Additionally or alternatively, the mapping table can compensate for PVT variation and/or for operation at a particular frequency. In certain implementations, the mapping table includes mapping data for two or more frequencies based on measuring the first parameter and the second parameter for different input signal frequencies to the phase shifter.

The method 310 can be implemented in accordance with any of the calibration schemes herein, including, but not limited to, any of Equations 1 to 9.

Applications

Devices employing the above described schemes can be implemented into various electronic devices. Examples of electronic devices include, but are not limited to, RF communication systems, consumer electronic products, electronic test equipment, communication infrastructure, etc. For instance, one or more phase shifters can be included in a wide range of RF communication systems, including, but not limited to, radar systems, base stations, mobile devices (for instance, smartphones or handsets), phased array antenna systems, laptop computers, tablets, and/or wearable electronics.

The teachings herein are applicable to RF communication systems operating over a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The signals amplified by the phase shifters herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

The invention claimed is:

1. A phase shifter with wideband operation, the phase shifter comprising:
   a quadrature filter configured to filter an input signal to generate an in-phase (I) voltage and a quadrature-phase (Q) voltage;
   a first variable gain amplifier (VGA) configured to amplify the I voltage received at an input to generate an I current at an output, wherein the first VGA comprises a plurality of transconductance stages that are individually selectable and connected in parallel with one another between the input and the output;
   a second VGA configured to amplify the Q voltage to generate a Q current; and
   a current mode combiner including a cascode transistor configured to receive the I current and the Q current and to generate an output signal, wherein a first gain setting of the first VGA and a second gain setting of the second VGA are operable to control a phase shift between the output signal and the input signal.

2. The phase shifter of claim 1, wherein a value of the first gain setting is operable to select one or more active transconductance stages from the plurality of transconductance stages for providing amplification.

3. The phase shifter of claim 2, wherein each of the plurality of transconductance stages includes current steering circuitry for selectively steering a stage current to the output or to a supply voltage.

4. The phase shifter of claim 2, the first VGA is implemented differentially and includes a non-inverted current output and an inverted current output, wherein each of the plurality of transconductance stages includes current steering circuitry for selectively steering a stage current to the non-inverted current output or the inverted current output.

5. The phase shifter of claim 2, wherein the first VGA is operable in a plurality of gain settings, wherein each of the plurality of transconductance stages is either off or operating with a substantially constant current density across the plurality of gain settings.

6. The phase shifter of claim 1, further comprising a mapping table configured to map a phase shift setting of the phase shifter to the first gain setting and the second gain setting, wherein the mapping table is calibrated to compensate for I/Q imbalance.

7. The phase shifter of claim 6 coupled to an s-parameter detector that is configured to generate a plurality of parameter measurements associated with a plurality of phase shift settings of the phase shifter, wherein the control circuit is configured to calibrate the mapping table based on the plurality of parameter measurements.

8. The phase shifter of claim 1, implemented in a front end system.

9. The phase shifter of claim 8, wherein the front end system comprises an amplifier in series with the phase shifter and configured to amplify the input signal.

10. A phase shifter with wideband operation, the phase shifter comprising:
   a quadrature filter configured to filter an input signal to generate an in-phase (I) voltage and a quadrature-phase (Q) voltage;
   a first variable gain amplifier (VGA) configured to amplify the I voltage to generate an I current;
   a second VGA configured to amplify the Q voltage to generate a Q current; and
   a current mode combiner configured to combine the I current and the Q current to generate an output signal, wherein a first gain setting of the first VGA and a second gain setting of the second VGA are operable to control a phase shift between the output signal and the input signal, wherein the current mode combiner comprises a cascode transistor, the current mode combiner configured to combine the I current and the Q current to generate a combined current that flows through the cascode transistor.

11. The phase shifter of claim 10, further comprising an output matching network including an output matching capacitor that receives the combined current.

12. A method of phase shifting, the method comprising:
filtering an input signal to generate an in-phase (I) voltage and a quadrature-phase (Q) voltage;
amplifying the I voltage to generate an I current using a first variable gain amplifier (VGA) of a phase shifter;
amplifying the Q voltage to generate a Q current using a second VGA of the phase shifter;
combining the I current and the Q current to generate an output signal using a current mode combiner of the phase shifter; and
controlling a phase shift between the output signal and input signal by controlling a first gain setting of the first VGA and a second gain setting of the second VGA,
wherein combining the I current and the Q current to generate the output signal includes summing the I current and the Q current to generate a combined current, and providing the combined current through a cascode transistor of a common-gate stage or a common-base stage.

13. The method of claim 12, wherein controlling the phase shift includes mapping a phase shift setting to the first gain setting and the second gain setting using a mapping table, and calibrating the mapping table.

14. The method of claim 13, wherein calibrating the mapping table includes setting the phase shifter in a first phase state by controlling the first gain setting and the second gain setting, measuring a first parameter of the phase shifter in the first phase state, setting the phase shifter in a second phase state by controlling the first gain setting and the second gain setting, measuring a second parameter of the phase shifter for the second phase state, and generating the mapping table based on the first parameter and the second parameter.

15. The method of claim 14, wherein the first phase state and the second phase state are separated by about ninety degrees.

16. The method of claim 15, wherein the first phase state provides a phase shift of about 0°, and the second phase state provides a phase shift of about 90°.

17. The method of claim 14, wherein the first parameter and the second parameter are s-parameters.

18. The method of claim 14, further comprising calibrating the mapping table for a target operating frequency.

19. The method of claim 14, wherein amplifying the I voltage includes selecting one or more active transconductance stages from the plurality of transconductance stages of the first VGA based on a value of the first VGA, controlling a polarity of I current using current steering circuitry of the plurality of transconductance stages.

20. The method of claim 19, further comprising integrating the combined current using an output matching capacitor.

* * * * *